(12) United States Patent
Lung

(10) Patent No.: US 7,642,123 B2
(45) Date of Patent: Jan. 5, 2010

(54) THERMALLY INSULATED PHASE CHANGE MEMORY MANUFACTURING METHOD

(75) Inventor: Hsiang-Lan Lung, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 15 days.

(21) Appl. No.: 12/173,299

(22) Filed: Jul. 15, 2008

(65) Prior Publication Data

US 2008/0268565 A1   Oct. 30, 2008

Related U.S. Application Data

(62) Division of application No. 11/352,755, filed on Feb. 13, 2006, now Pat. No. 7,471,555.

(60) Provisional application No. 60/736,721, filed on Nov. 15, 2005.

(51) Int. Cl.
*H01L 21/00* (2006.01)

(52) U.S. Cl. .................. 438/95; 438/102; 438/238; 257/E21.001

(58) Field of Classification Search .................. 438/95, 438/102, 238
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,452,592 A | 6/1984 | Tsai | |
| 4,599,705 A | 7/1986 | Holmberg et al. | |
| 4,719,594 A | 1/1988 | Young et al. | |
| 4,769,339 A | 9/1988 | Ishii et al. | |
| 4,876,220 A | 10/1989 | Mohsen et al. | |
| 4,959,812 A | 9/1990 | Momodomi et al. | |
| 5,106,775 A | 4/1992 | Kaga et al. | |
| 5,166,096 A | 11/1992 | Cote et al. | |
| 5,166,758 A | 11/1992 | Ovshinsky et al. | |

(Continued)

FOREIGN PATENT DOCUMENTS

WO          9712393          4/1997

(Continued)

OTHER PUBLICATIONS

"New Memories Tap Spin, Gird for Battle," Science News, Apr. 3, 1999, p. 223, vol. 155.

(Continued)

*Primary Examiner*—Jack Chen
(74) *Attorney, Agent, or Firm*—James F. Hann; Haynes Beffel & Wolfeld LLP

(57) ABSTRACT

A thermally insulated memory device includes a memory cell, the memory cell having electrodes with a via extending therebetween, a thermal insulator within the via and defining a void extending between the electrode surfaces. A memory material, such as a phase change material, is within the void and electrically couples the electrodes to create a memory material element. The thermal insulator helps to reduce the power required to operate the memory material element. An electrode may contact the outer surface of a plug to accommodate any imperfections, such as the void-type imperfections, at the plug surface. Methods for making the device and accommodating plug surface imperfections are also disclosed.

10 Claims, 6 Drawing Sheets

U.S. PATENT DOCUMENTS

| | | |
|---|---|---|
| 5,177,567 A | 1/1993 | Klersy et al. |
| 5,332,923 A | 7/1994 | Takeuchi et al. |
| 5,391,901 A | 2/1995 | Tanabe et al. |
| 5,515,488 A | 5/1996 | Hoppe et al. |
| 5,534,712 A | 7/1996 | Ovshinsky et al. |
| 5,550,396 A | 8/1996 | Tsutsumi et al. |
| 5,687,112 A | 11/1997 | Ovshinsky |
| 5,688,713 A | 11/1997 | Linliu et al. |
| 5,716,883 A | 2/1998 | Tseng et al. |
| 5,789,277 A | 8/1998 | Zahorik et al. |
| 5,789,758 A | 8/1998 | Reinberg |
| 5,807,786 A | 9/1998 | Chang et al. |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan et al. |
| 6,025,220 A | 2/2000 | Sandhu |
| 6,031,287 A | 2/2000 | Harshfield |
| 6,034,882 A | 3/2000 | Johnson et al. |
| 6,066,870 A | 5/2000 | Siek |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,483,736 B2 | 11/2002 | Johnson et al. |
| 6,487,114 B2 | 11/2002 | Jong et al. |
| 6,489,645 B1 | 12/2002 | Uchiyama |
| 6,501,111 B1 | 12/2002 | Lowrey |
| 6,507,061 B1 | 1/2003 | Hudgens et al. |
| 6,511,867 B2 | 1/2003 | Lowrey et al. |
| 6,512,241 B1 | 1/2003 | Lai |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda et al. |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B1 | 6/2003 | Lung et al. |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng et al. |
| 6,597,009 B2 | 7/2003 | Wicker |
| 6,605,477 B2 | 8/2003 | Uchiyama |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,744,088 B1 | 6/2004 | Dennison |
| 6,750,079 B2 | 6/2004 | Lowrey et al. |
| 6,750,101 B2 | 6/2004 | Lung et al. |
| 6,791,102 B2 | 9/2004 | Johnson et al. |
| 6,797,979 B2 | 9/2004 | Chiang et al. |
| 6,805,563 B2 | 10/2004 | Ohashi et al. |
| 6,815,704 B1 | 11/2004 | Chen |
| 6,838,692 B1 | 1/2005 | Lung et al. |
| 6,850,432 B2 | 2/2005 | Lu et al. |
| 6,859,389 B2 | 2/2005 | Idehara et al. |
| 6,861,267 B2 | 3/2005 | Xu et al. |
| 6,864,500 B2 | 3/2005 | Gilton |
| 6,864,503 B2 | 3/2005 | Lung et al. |
| 6,867,638 B2 | 3/2005 | Saiki et al. |
| 6,888,750 B2 | 5/2005 | Walker et al. |
| 6,894,304 B2 | 5/2005 | Moore |
| 6,894,305 B2 | 5/2005 | Yi et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,928,022 B2 | 8/2005 | Cho et al. |
| 6,933,516 B2 | 8/2005 | Xu |
| 6,936,544 B2 | 8/2005 | Huang et al. |
| 6,936,840 B2 | 8/2005 | Sun et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg et al. |
| 6,992,932 B2 | 1/2006 | Cohen et al. |
| 7,023,009 B2 | 4/2006 | Kostylev et al. |
| 7,029,924 B2 | 4/2006 | Hsu et al. |
| 7,033,856 B2 | 4/2006 | Lung et al. |
| 7,038,230 B2 | 5/2006 | Chen et al. |
| 7,038,938 B2 | 5/2006 | Kang et al. |
| 7,042,001 B2 | 5/2006 | Kim et al. |
| 7,067,864 B2 | 6/2006 | Nishida et al. |
| 7,067,865 B2 | 6/2006 | Lung et al. |
| 7,078,273 B2 | 7/2006 | Matsuoka et al. |
| 7,115,927 B2 | 10/2006 | Hideki et al. |
| 7,122,281 B2 | 10/2006 | Pierrat |
| 7,122,824 B2 | 10/2006 | Khouri et al. |

| | | | | | |
|---|---|---|---|---|---|
| 7,126,149 B2 | 10/2006 | Iwasaki et al. | 2006/0157681 A1 | 7/2006 | Chen et al. |
| 7,132,675 B2 | 11/2006 | Gilton | 2006/0194403 A1 | 8/2006 | Li et al. |
| 7,154,774 B2 | 12/2006 | Bedeschi et al. | 2006/0226409 A1 | 10/2006 | Burr et al. |
| 7,164,147 B2 | 1/2007 | Lee et al. | 2006/0226411 A1 | 10/2006 | Lee |
| 7,166,533 B2 | 1/2007 | Happ | 2006/0234138 A1 | 10/2006 | Fehlhaber et al. |
| 7,169,635 B2 | 1/2007 | Kozicki | 2006/0284157 A1 | 12/2006 | Chen et al. |
| 7,202,493 B2 | 4/2007 | Lung et al. | 2006/0284158 A1 | 12/2006 | Lung et al. |
| 7,208,751 B2 | 4/2007 | Ooishi et al. | 2006/0284214 A1 | 12/2006 | Chen |
| 7,214,958 B2 | 5/2007 | Happ | 2006/0284279 A1 | 12/2006 | Lung et al. |
| 7,220,983 B2 | 5/2007 | Lung | 2006/0286709 A1 | 12/2006 | Lung et al. |
| 7,238,994 B2 | 7/2007 | Chen et al. | 2006/0286743 A1 | 12/2006 | Lung et al. |
| 7,248,494 B2 | 7/2007 | Oh et al. | 2006/0289848 A1 | 12/2006 | Dennison |
| 7,251,157 B2 | 7/2007 | Osada et al. | 2007/0008786 A1 | 1/2007 | Scheuerlein |
| 7,253,429 B2 | 8/2007 | Klersy et al. | 2007/0030721 A1 | 2/2007 | Segal et al. |
| 7,269,052 B2 | 9/2007 | Segal et al. | 2007/0037101 A1 | 2/2007 | Morioka |
| 7,277,317 B2 | 10/2007 | Le Phan et al. | 2007/0072125 A1 | 3/2007 | Sousa et al. |
| 7,291,556 B2 | 11/2007 | Choi et al. | 2007/0096162 A1 | 5/2007 | Happ et al. |
| 7,309,630 B2 | 12/2007 | Fan et al. | 2007/0108077 A1 | 5/2007 | Lung et al. |
| 7,321,130 B2 | 1/2008 | Lung et al. | 2007/0108429 A1 | 5/2007 | Lung |
| 7,323,708 B2 | 1/2008 | Lee et al. | 2007/0108430 A1 | 5/2007 | Lung |
| 7,332,370 B2 | 2/2008 | Chang et al. | 2007/0108431 A1 | 5/2007 | Chen et al. |
| 7,336,526 B2 | 2/2008 | Osada et al. | 2007/0109836 A1 | 5/2007 | Lung |
| 7,351,648 B2 | 4/2008 | Furukawa et al. | 2007/0109843 A1 | 5/2007 | Lung et al. |
| 7,359,231 B2 | 4/2008 | Venkataraman et al. | 2007/0111429 A1 | 5/2007 | Lung |
| 7,364,935 B2 | 4/2008 | Lung et al. | 2007/0115794 A1 | 5/2007 | Lung |
| 7,365,385 B2 | 4/2008 | Abbott | 2007/0117315 A1 | 5/2007 | Lai et al. |
| 7,379,328 B2 | 5/2008 | Osada et al. | 2007/0121363 A1 | 5/2007 | Lung |
| 7,385,235 B2 | 6/2008 | Lung et al. | 2007/0121374 A1 | 5/2007 | Lung et al. |
| 7,393,798 B2 | 7/2008 | Campbell | 2007/0126040 A1 | 6/2007 | Lung |
| 7,394,088 B2 | 7/2008 | Lung | 2007/0131922 A1 | 6/2007 | Lung |
| 7,397,060 B2 | 7/2008 | Lung | 2007/0131980 A1 | 6/2007 | Lung |
| 7,423,300 B2 | 9/2008 | Lung et al. | 2007/0138458 A1 | 6/2007 | Lung |
| 7,426,134 B2 | 9/2008 | Happ et al. | 2007/0147105 A1 | 6/2007 | Lung et al. |
| 7,569,844 B2 * | 8/2009 | Lung ........................... 257/2 | 2007/0153563 A1 | 7/2007 | Nirschl |
| 2002/0070457 A1 | 6/2002 | Sun et al. | 2007/0154847 A1 | 7/2007 | Chen et al. |
| 2002/0113273 A1 | 8/2002 | Hwang et al. | 2007/0155172 A1 | 7/2007 | Lai et al. |
| 2003/0072195 A1 | 4/2003 | Mikolajick | 2007/0158632 A1 | 7/2007 | Ho |
| 2003/0095426 A1 | 5/2003 | Hush et al. | 2007/0158633 A1 | 7/2007 | Lai et al. |
| 2003/0186481 A1 | 10/2003 | Lung | 2007/0158645 A1 | 7/2007 | Lung |
| 2003/0224598 A1 | 12/2003 | Lee et al. | 2007/0158690 A1 | 7/2007 | Ho et al. |
| 2004/0026686 A1 | 2/2004 | Lung | 2007/0158862 A1 | 7/2007 | Lung |
| 2004/0051094 A1 | 3/2004 | Ooishi | 2007/0161186 A1 | 7/2007 | Ho |
| 2004/0165422 A1 | 8/2004 | Hideki et al. | 2007/0173019 A1 | 7/2007 | Ho et al. |
| 2004/0248339 A1 | 12/2004 | Lung | 2007/0173063 A1 | 7/2007 | Lung |
| 2004/0256610 A1 | 12/2004 | Lung | 2007/0176261 A1 | 8/2007 | Lung |
| 2005/0018526 A1 | 1/2005 | Lee | 2007/0187664 A1 | 8/2007 | Happ |
| 2005/0029502 A1 | 2/2005 | Hudgens | 2007/0201267 A1 | 8/2007 | Happ et al. |
| 2005/0037546 A1 | 2/2005 | Yeh et al. | 2007/0215852 A1 | 9/2007 | Lung |
| 2005/0062087 A1 | 3/2005 | Chen et al. | 2007/0224726 A1 | 9/2007 | Chen et al. |
| 2005/0093022 A1 | 5/2005 | Lung | 2007/0235811 A1 | 10/2007 | Furukawa et al. |
| 2005/0110983 A1 | 5/2005 | Jeong et al. | 2007/0236989 A1 | 10/2007 | Lung |
| 2005/0145984 A1 | 7/2005 | Chen et al. | 2007/0246699 A1 | 10/2007 | Lung |
| 2005/0191804 A1 | 9/2005 | Lai et al. | 2007/0249090 A1 | 10/2007 | Philipp et al. |
| 2005/0201182 A1 | 9/2005 | Osada et al. | 2007/0257300 A1 | 11/2007 | Ho et al. |
| 2005/0212024 A1 | 9/2005 | Happ | 2007/0262388 A1 | 11/2007 | Ho et al. |
| 2005/0215009 A1 | 9/2005 | Cho | 2007/0274121 A1 | 11/2007 | Lung et al. |
| 2006/0006472 A1 | 1/2006 | Jiang | 2007/0285960 A1 | 12/2007 | Lung et al. |
| 2006/0038221 A1 | 2/2006 | Lee et al. | 2007/0298535 A1 | 12/2007 | Lung |
| 2006/0054950 A1 | 3/2006 | Baek et al. | 2008/0006811 A1 | 1/2008 | Philipp et al. |
| 2006/0066156 A1 | 3/2006 | Dong et al. | 2008/0012000 A1 | 1/2008 | Harshfield |
| 2006/0073642 A1 | 4/2006 | Yeh et al. | 2008/0014676 A1 | 1/2008 | Lung et al. |
| 2006/0091476 A1 | 5/2006 | Pinnow et al. | 2008/0025089 A1 | 1/2008 | Scheuerlein et al. |
| 2006/0094154 A1 | 5/2006 | Lung | 2008/0043520 A1 | 2/2008 | Chen |
| 2006/0108667 A1 | 5/2006 | Lung | 2008/0094871 A1 | 4/2008 | Parkinson |
| 2006/0110878 A1 | 5/2006 | Lung et al. | 2008/0101110 A1 | 5/2008 | Happ et al. |
| 2006/0110888 A1 | 5/2006 | Cho et al. | 2008/0137400 A1 | 6/2008 | Chen et al. |
| 2006/0113521 A1 | 6/2006 | Lung | 2008/0164453 A1 | 7/2008 | Breitwisch et al. |
| 2006/0118913 A1 | 6/2006 | Yi et al. | 2008/0165569 A1 | 7/2008 | Chen et al. |
| 2006/0124916 A1 | 6/2006 | Lung | 2008/0165570 A1 | 7/2008 | Happ et al. |
| 2006/0126395 A1 | 6/2006 | Chen et al. | 2008/0165572 A1 | 7/2008 | Lung |
| 2006/0131555 A1 | 6/2006 | Liu et al. | 2008/0166875 A1 | 7/2008 | Lung |
| 2006/0138467 A1 | 6/2006 | Lung | 2008/0179582 A1 | 7/2008 | Burr et al. |
| 2006/0154185 A1 | 7/2006 | Ho et al. | 2008/0180990 A1 | 7/2008 | Lung |

| 2008/0186755 A1 | 8/2008 | Lung et al. |
| 2008/0191187 A1 | 8/2008 | Lung et al. |
| 2008/0192534 A1 | 8/2008 | Lung |
| 2008/0224119 A1 | 9/2008 | Burr et al. |
| 2008/0225489 A1 | 9/2008 | Cai et al. |

FOREIGN PATENT DOCUMENTS

| WO | 0079539 | 12/2000 |
| WO | 0145108 | 6/2001 |

OTHER PUBLICATIONS

"Optimized Thermal Capacitance in a Phase Change Memory Cell Design," IPCOM000141986D, Prior Art Database, Oct. 18, 2006, 4pp.

"Remembering on the Cheap," Mar. 19, 2005, p. 189, vol. 167.

"Thermal Conductivity of Crystalline Dielectrics" in CRC Handbook of Chemistry and Physics, Internet Version 2007, (87th edition), David R. Lide, ed. Taylor and Francis, Boca Raton, FL, 2pp.

Adler, D. et al., "Threshold Switching in Chalcogenide-Glass Thin Films," J. Appl/Phys 51(6), Jun. 1980, pp. 3289-3309.

Adler, David, "Amorphous-Semiconductor Devices," Sci. Amer., vol. 236, pp. 36-48, May 1977.

Ahn, S. J. et al., "A Highly Manufacturable High Density Phase Change Memory of 64 Mb and Beyond," IEEE IEDM 2004, pp. 907-910.

Atwood, G, et al., "90 nm Phase Change Technology with u Trench and Lance Cell Elements," VLSI Technology, Systems and Applications, Apr. 23-25, 2007, pp. 1-2.

Axon Technologies Corporation paper: Technology Description, pp. 1-6.

Bedeschi, F. et al., "4-MB MOSFET-Selected Phase-Change Memory Experimental Chip," IEEE, 2004, 4 PP.

Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.

Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gibson, G. A. et al., "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al., "An Edge Contact Type Cell fro Phase Change RAM Featuring Very Low Power Consumption," 2003 Symposium on VLSI Technology Digest of Technical Papers, pp. 175-176.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24um-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L., "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Mott, Nevill, "Electrons in Glass," Nobel Lecture, Dec. 8, 1977, Physics, 1977, pp. 403-413.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase -Change Memory Cell for Embedded and Stand-Alone Non-Volatile Memory Applications," 2004 Symposium on VLSI Technology Digest of Technical Papers, pp. 18-19.

Pirovano, Agostino et al.,"Reliability Study of Phase-Change Nonvolatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

* cited by examiner

THERMALLY INSULATED PHASE CHANGE MEMORY MANUFACTURING METHOD

RELATED APPLICATION DATA

This application is a divisional patent application of patent application Ser. No. 11/352,755, filed 13 Feb. 2006, entitled THERMALLY INSULATED PHASE CHANGE MEMORY DEVICE AND MANUFACTURING METHOD, which application is incorporated herein by reference, which claims the benefit of U.S. Provisional Patent Application No. 60/736,721, filed 15 Nov. 2005, entitled THERMALLY CONTAINED/INSULATED PHASE CHANGE MEMORY DEVICE AND METHOD.

PARTIES TO A JOINT RESEARCH AGREEMENT

International Business Machines Corporation, a New York corporation; Macronix International Corporation, Ltd., a Taiwan corporation, and Infineon Technologies A.G., a German corporation, are parties to a Joint Research Agreement.

BACKGROUND OF THE INVENTION

1. Field of the Invention

The present invention relates to high density memory devices based on programmable resistive memory materials, including phase change materials and other materials, and to methods for manufacturing such devices.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state; this difference in resistance can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from crystalline state to amorphous state. The magnitude of the reset current needed for reset can be reduced by reducing the size of the phase change material element in the cell and by reducing the size of the contact area between electrodes and the phase change material, so that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000; Chen, "Phase Change Memory Device Employing Thermally Insulating Voids," U.S. Pat. No. 6,815,704 B1, issued Nov. 9, 2004.

Problems have arisen in manufacturing such devices with very small dimensions, and with variations in process that meet tight specifications needed for large-scale memory devices. It is desirable therefore to provide a memory cell structure having small dimensions and low reset currents, and a method for manufacturing such structure.

SUMMARY OF THE INVENTION

A first aspect of the invention is directed to a thermally insulated memory device comprising a memory cell access layer and a memory cell layer, operably coupled to the memory cell access layer. The memory cell layer comprises a memory cell, the memory cell comprising: first and second electrodes having opposed, spaced apart electrode surfaces; a via extending between the electrode surfaces; a thermal insulator within the via, the thermal insulator comprising a sidewall structure in the via defining a void extending between the electrode surfaces; and a memory material such as a phase change material, within the void electrically coupling the electrode surfaces. The thermal insulator helps to reduce the power required to operate the memory material. In some embodiments the memory cell layer comprises an inter-electrode insulator made using a dielectric material through which the via extends, and the thermal insulator has a thermal insulation value greater than a thermal insulation value of the dielectric material of the inter-electrode layer. The thermal insulator may define a sidewall structure having an inside surface tapering inwardly from the electrode surface of the second electrode towards the electrode surface of the first electrode so that a cross-sectional area of the insulated via is smaller at the first electrode than at the second electrode, forming a void having a constricted region near the first electrode member, the memory material element filling the constricted region. The memory cell access layer may comprise an outer surface and an electrically conductive plug extending to the outer surface from underlying terminals formed for example by doped regions in a semiconductor substrate, the plug having a plug surface, the plug surface constituting a portion of the outer surface of the electrode layer. The first electrode overlies at least a substantial portion of the plug surface; whereby at least some imperfections at the plug surface are accommodated by the first electrode. In embodiments described herein, the electrode surface first electrode is substantially planar, in the region of the via, where the substantially planar surface can be formed for example by chemical mechanical polishing or other planarizing procedures that intend to improve the planarity of the electrode surface relative to the electrode material as deposited over the imperfections, and prior to planarization.

A second aspect of the invention is directed to a method for making a thermally insulated memory device. A memory cell access layer is formed on a substrate, the memory cell access layer comprising an upper surface. A first electrode layer is deposited and planarized on the upper surface. An inter-electrode layer is deposited on the first electrode layer. A via is created within the inter-electrode layer. A thermal insulator having an open region is formed within the via, by for example forming sidewall structures on sidewalls of the via. A memory material is deposited within the open region. A second electrode layer is deposited over and in contact with the memory material. According to some embodiments the material of the thermal insulator has a thermal insulation value greater than (or stated oppositely, thermal conductivity less than) the thermal insulation value of the dielectric material used for the inter-electrode layer.

A third aspect of the invention is directed to plug-surface void-filling memory device comprising a memory cell access layer comprising an outer surface and an electrically conductive plug extending to the outer surface, the plug having a plug surface, the plug surface constituting a portion of the outer surface, the plug surface having an imperfection; and a memory cell layer contacting the memory cell access layer, the memory cell layer comprising a memory cell. The memory cell comprises first and second electrodes having opposed, spaced apart electrode surfaces, the first electrode contacting at least a substantial portion of the plug surface; and a memory material electrically coupling the electrode surfaces to create a memory material element; whereby the imperfection at the plug surface is accommodated by the first electrode. In some embodiments a void-type imperfection at the plug surface is filled by depositing and planarizing the material used to form the first electrode.

A fourth aspect of the invention is directed to a method for accommodating an imperfection in an outer surface of an electrically conductive plug of a semiconductor device. The method comprises depositing an electrode on the outer service of the plug.

The method described herein for formation of the phase change element for use in a memory cell in a phase change random access memory (PCRAM) device, can be used to make small phase change elements, bridges or similar structures for other devices.

Various features and advantages of the invention will appear from the following description in which the preferred embodiments have been set forth in detail in conjunction with the accompanying drawings.

BRIEF DESCRIPTION OF THE DRAWINGS

FIG. 2 illustrates the final stages for making the memory cell access layer of FIG. 1;

FIG. 3 illustrates the deposition of a first electrode layer on top of the memory cell access layer of FIG. 2;

FIG. 4 illustrates the result of depositing an inter-layer dielectric onto the first electrode layer of FIG. 3;

FIG. 5 shows vias formed in the inter-layer dielectric of FIG. 4;

FIG. 6 illustrates thermal insulators deposited as sidewall structures within the vias of FIG. 5;

FIG. 7 shows phase change material deposited within the open regions of the thermal insulators of FIG. 6;

FIG. 8 illustrates a second electrode layer deposited onto the structure of FIG. 7;

FIG. 9 illustrates the formation of a lithographic mask overlying certain areas on the second electrode layer for memory cell isolation;

FIG. 10 illustrates the result of etching the structure of FIG. 9; and

FIG. 11 shows the structure of FIG. 10 after deposition of a dielectric fill within the etched regions.

DETAILED DESCRIPTION

Figure 1:
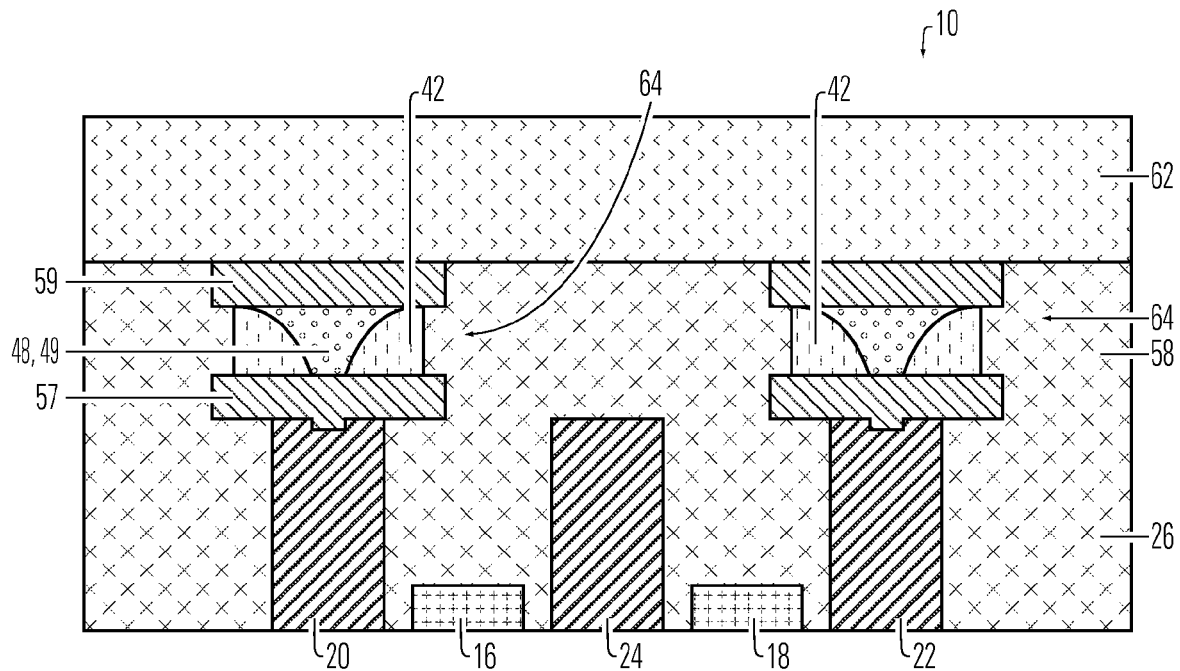
FIG. 1 is a simplified cross-sectional view of a phase change memory device made according to the invention.

The following description of the invention will typically be with reference to specific structural embodiments and methods. It is to be understood that there is no intention to limit the invention to the specifically disclosed embodiments and methods but that the invention may be practiced using other features, elements, methods and embodiments. Like elements in various embodiments are commonly referred to with like reference numerals.

FIG. 1 is a simplified cross-sectional view of a phase change memory device 10 made according to one embodiment of the invention. Device 10 comprises broadly a memory cell access layer 12 formed on a substrate, not shown, and a memory cell layer 14 formed on top of access layer 12. Access layer 12 typically comprises access transistors; other types of access devices may also be used. Access layer 12 comprises first and second polysilicon word lines acting as first and second elements 16, 18, first and second plugs 20, 22 and a common source line 24 all within a dielectric fill layer 26. A memory cell overlies the plug 20 in the access layer, and comprises bottom electrode member 57, thermally insulating sidewalls structures 42, programmable resistive material element 46 and top electrode member 59. Overlying bit line structures 62 are coupled to the top electrode member 59.

Figure 2:
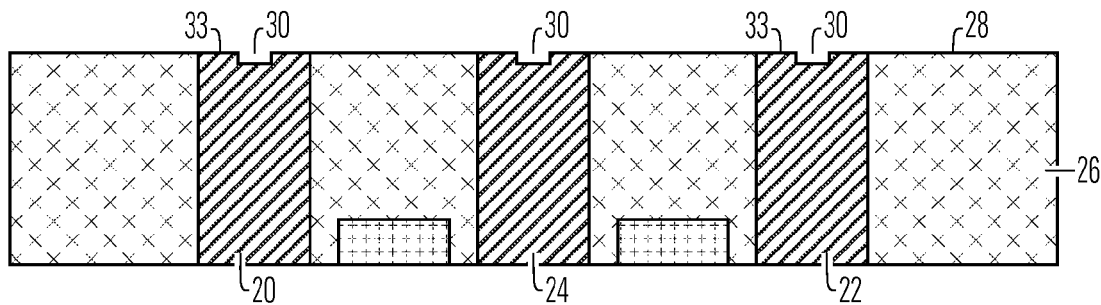
FIGS. 2-11 illustrate a method for making phase change memory devices, such as the device of FIG. 1.

Phase change memory device 10 and its method of manufacturer will be described with reference to FIGS. 2-11. Referring now to FIG. 2, memory cell access layer 12 is seen to have a generally flat upper surface 28, the upper surface being interrupted by voids 30 formed in plugs 20, 22 and by void 32 formed in common source line 24. Voids 30, 32, or other surface imperfections, are formed for example as an artifact of the deposition process used for formation of tungsten plugs within small dimension vias. Deposition of a memory material directly onto the upper surfaces 33 of plugs 20, 22 can create a distribution problem, that is create an increased variance in the operational characteristics of the devices, and in the amount of memory material in each memory element due to the existence of voids 30.

Figure 3:
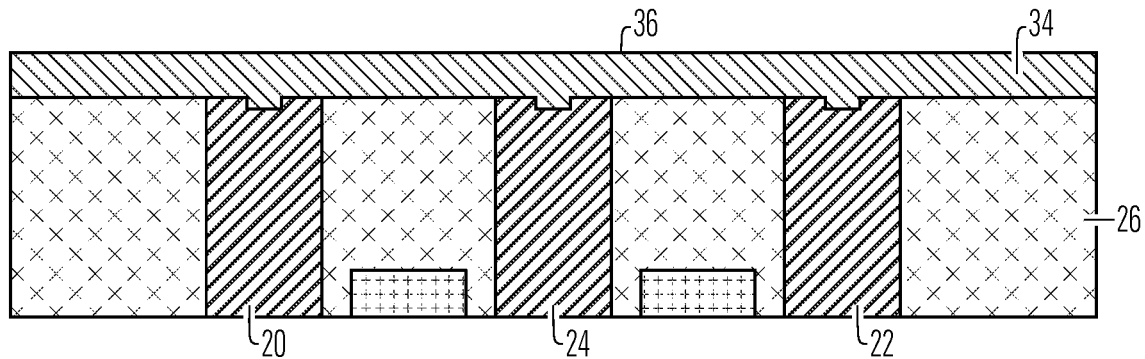
Figure 4:
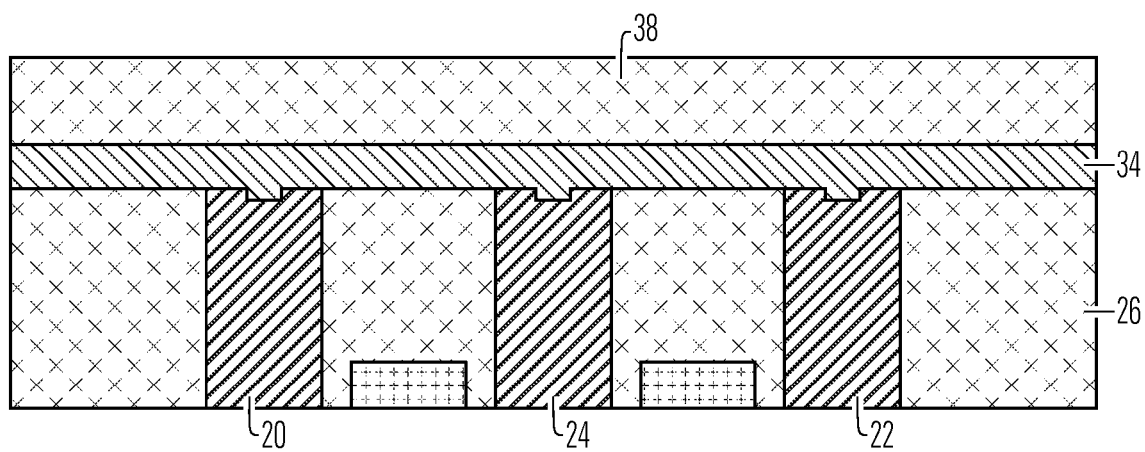
Figure 5:
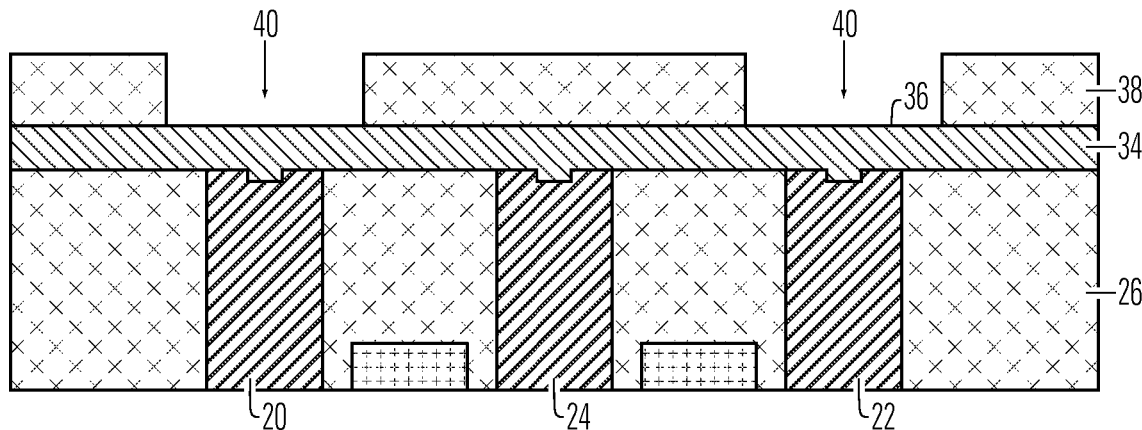

FIG. 3 illustrates the results of TiN deposition to create a first electrode layer 34 and chemical mechanical polishing CMP of layer 34 to create a planarized surface 36. Layer 34 is preferably about 100 to 800 nm thick, typically about 500 nm thick after planarization. First electrode layer 34 fills voids 30, 32 to effectively eliminate the distribution problem that could be created by the voids or other surface imperfections. Planarization removes artifacts of the voids that result from deposition of the electrode material layer 34 over the imperfections. An inter-electrode layer 38, see FIG. 4, is deposited on layer 34. Layer 38 may comprise one or more layer of an electrical insulator such as silicon dioxide, or variants thereof, is preferably about 40 to 80 nm thick, typically about 60 nm thick for the illustrated example. Vias 40, see FIG. 5, are formed in inter-electrode layer 38, typically using an appropriate lithographic mask, not shown, generally centered, within alignment tolerances of the manufacturing processes, above plugs 20, 22. Vias 40 have a diameter of about the technology node, that is about 90 to 150 nm, typically about 130 nm for a technology node having a minimum lithographic feature size of 0.13 microns.

A thermal insulator 42 is formed within each via 40, using a conformal deposition process such as chemical vapor deposition (CVD). Thermal insulator 42 is a better thermal insulator than the material of inter-electrode layer 38, preferably at least 10% better. Therefore, when the inter-layer dielectic comprises silicon dioxide, the thermal insulator 42 preferrably has a thermal conductivity value "kappa" of less than that of silicon dioxide which is 0.014 J/cm*K*sec. Representative materials for thermal insulator 42 include materials that are a combination of the elements silicon Si, carbon C, oxygen O, fluorine F, and hydrogen H. Examples of thermally insulating materials which are candidates for use as thermal insulator 42 include SiCOH, polyimide, polyamide, and fluorocarbon polymers. Other examples of materials which are candidates for use for thermal insulator 42 include fluorinated $SiO_2$, silsesquioxane, polyarylene ethers, parylene, fluoro-polymers, fluorinated amorphous carbon, diamond like carbon, porous silica, mesoporous silica, porous silsesquioxane, porous polyimide, and porous polyarylene ethers. In other embodiments, the thermally insulating structure comprises a gas-filled void lining the walls of via 40. A single layer or combination of layers can provide thermal insulation.

Figure 6:
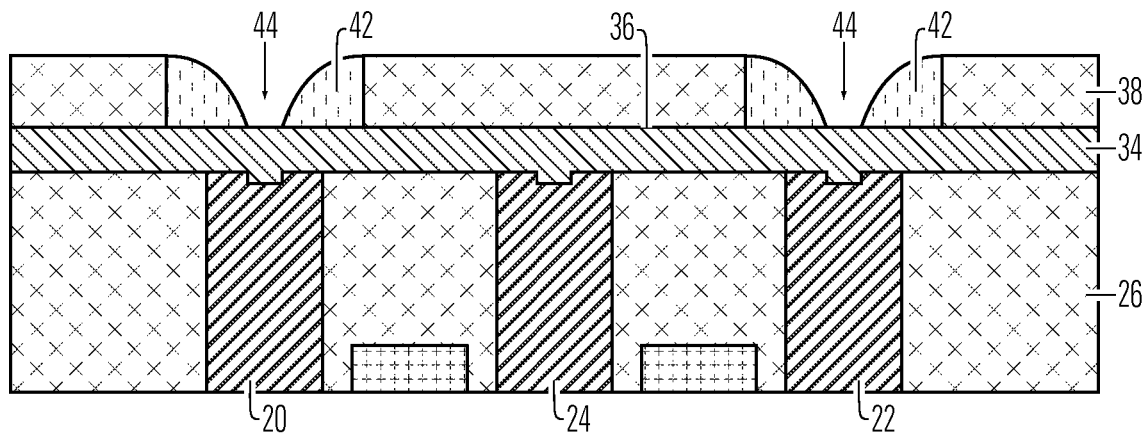
Figure 7:
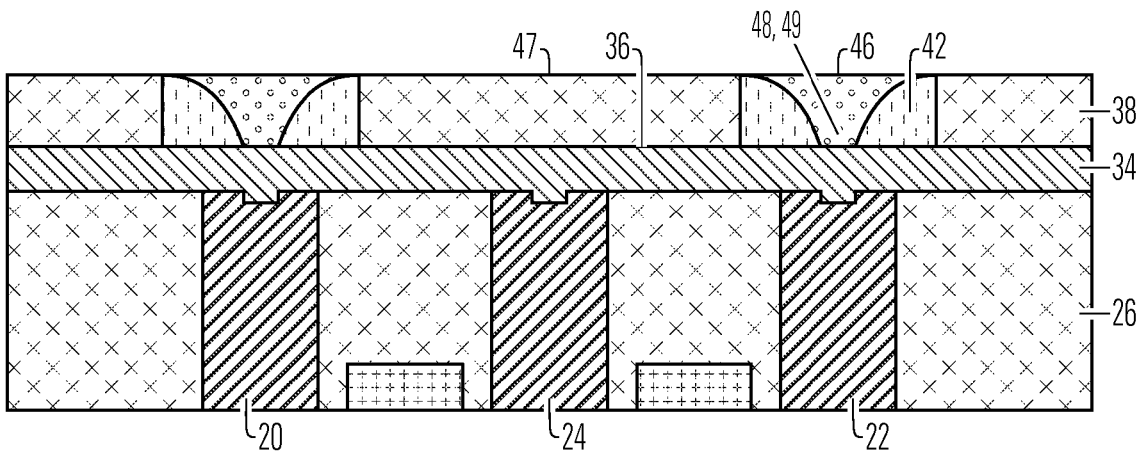

Thermal insulator 42 is preferably formed as sidewall structure to create the generally conical, downwardly and inwardly tapering central open region 44 shown in FIG. 6. For example, the thermal insulator 42 can be formed by depositing a conformal layer of the material over the vias, and anisotropically etching the layer to expose the bottom electrode surface leaving the sidewall structures, with open region 44 to define a thermally insulated via. Open region 44 could have other constricting shapes, such as an hourglass shape, a reverse conical shape or a staircase or otherwise stepped shape. It may also be possible to make open region with a constant, appropriately small cross-sectional size and thus without a constricted area. The shape of open region 44 may be the result of the deposition process chosen for the deposition of thermal insulator 42; the deposition of thermal insulator 42 may also be controlled to result in the desired, typically constricting, shape for open region 44. Processing steps may be also undertaken after deposition of thermal insulator 42 to create the desired shape for open region 44. FIG. 7 illustrates a result of depositing a phase change material 46 within central open region 44, followed by chemical mechanical polishing to create a surface 47. Phase change material 46 is thermally insulated from layer 38 by thermal insulator 42. The downwardly and inwardly tapering shape of thermal insulator 42 creates a narrow transition region 48 of change material 46 to create a phase change element 49 at region 48. Phase change material 46 is typically about 130 nm wide at surface 47 and about 30 to 70 nm, typically about 50 nm, at transition region 48.

Both the smaller size of phase change element 49 at transition region 48 and the use of thermal insulator 42 reduce the current needed to cause a change between a lower resistivity, generally crystalline state and a higher resistivity, generally amorphous state for phase change element 49.

Figure 8:
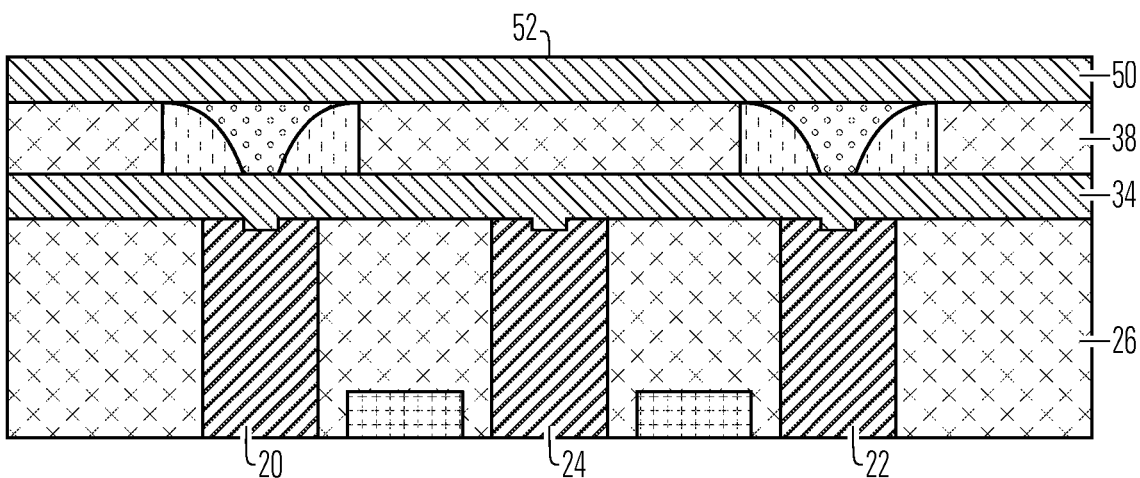
Figure 9:
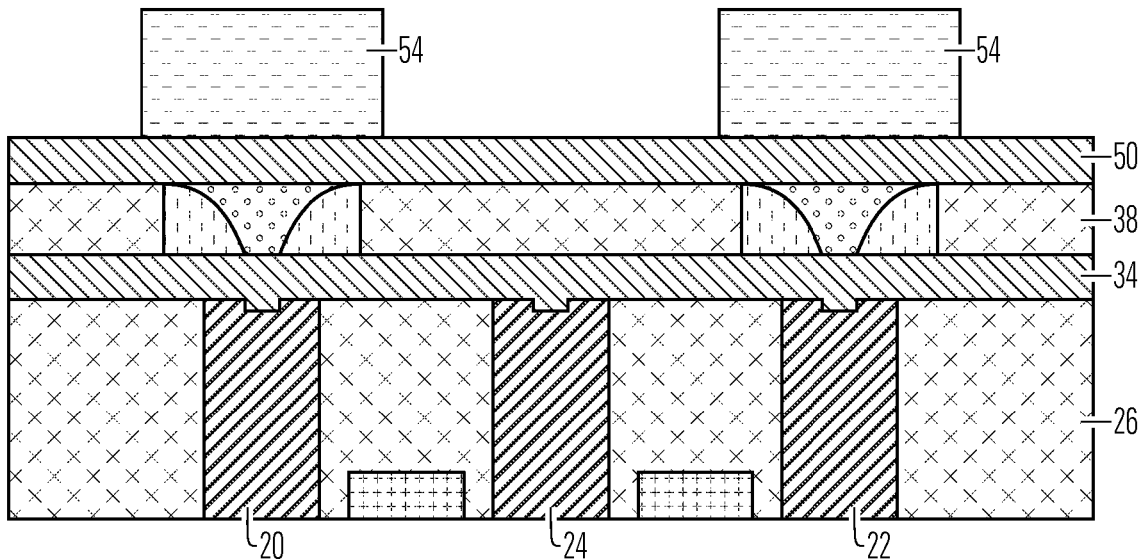
Figure 10:
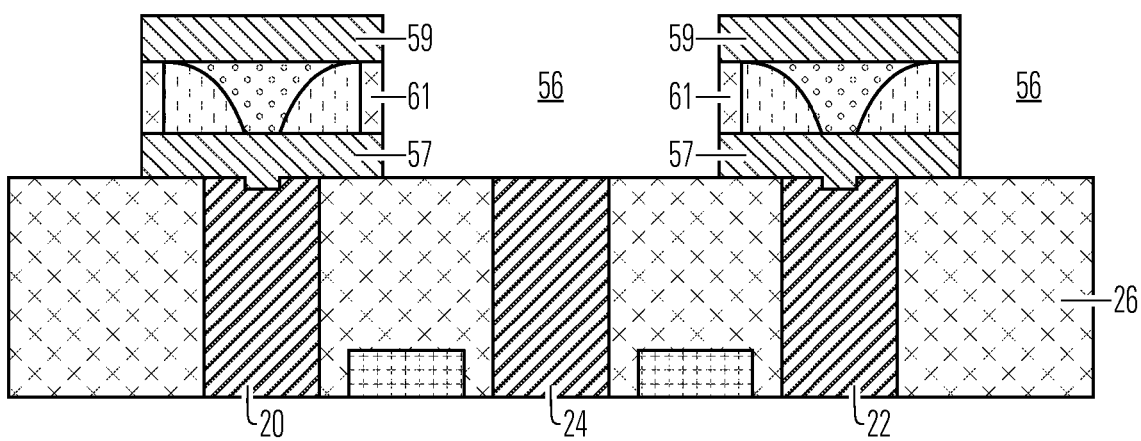

FIG. 8 illustrates the results of TiN deposition and chemical mechanical polishing to create a second electrode layer 50 having a planarized surface 52. Lithographic mask 54 is shown in FIG. 9 positioned overlying first and second plugs 20, 22 and their associated thermal insulators 42 and phase change materials 46. FIG. 10 illustrates the results of etching steps in which portions of second electrode layer 50, silicon dioxide layer 38 and first electrode layer 34 not covered by mask 54 are removed using appropriate etching recipes according to the composition of the layers to create etched regions 56 and first and second electrode members 57, 59.

Lithographic mask 54 is sized so that portions 61 of inter-electrode layer 38 are left surrounding thermal insulators 42 after the etching steps of FIG. 10 to prevent etching of thermal insulator 42, which could be caused by conventional tolerances associated with conventional manufacturing steps.

Figure 11:
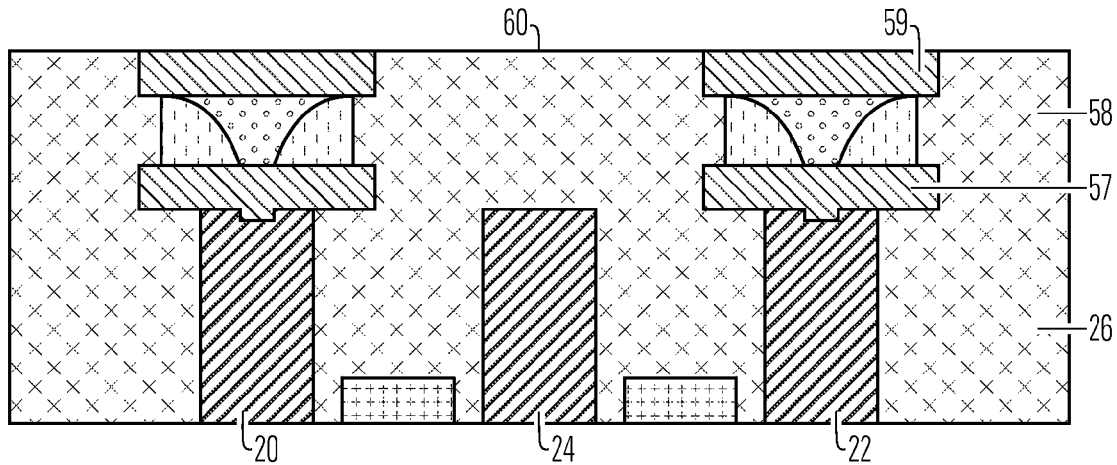

FIG. 11 illustrates the results of a dielectric fill-in step in which an fill 58, such as silicon dioxide, is deposited within etched regions 56, reconstituting the inter-electrode layer 48 and filling between the memory cells, and followed by CMP to create planarized surface 60. Thereafter, an electrically conductive material 62 is deposited on surface 60 and patterned to create bit lines for the phase change memory device 10, including memory cells 64, shown in FIG. 1. Electrically conductive material 62 is typically copper or aluminum, or alloys thereof, but it also may be tungsten, titanium nitride or other materials and combinations of materials.

Figure 12:
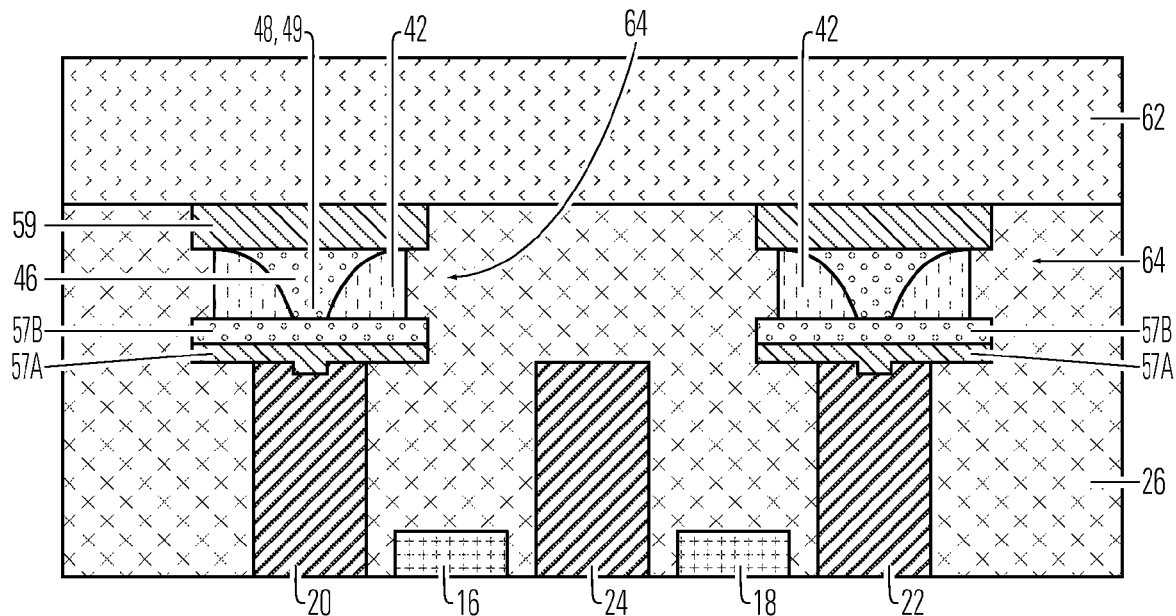
FIG. 12 illustrates an alternative embodiment of a phase change memory device.

In an alternative embodiment, as shown in FIG. 12, the bottom electrode 57 comprises a multilayer structure. As shown in FIG. 12, the electrode 57 includes a first layer 57A corresponding to bottom electrode 57 of FIG. 11, and a second layer 57B. Second layer 57B separates first layer 57A from phase change element 49 at region 48 of phase change material 46.

Electrodes 57, 59 in the illustrated embodiments are preferably TiN. Although other materials, such as TaN, TiAlN or TaAlN, or composite structures comprising copper or tungsten for example with thin film diffusion barriers made of TiN or other materials, may be used for electrodes 57, 59. TiN is presently preferred because it makes good contact with GST (discussed below) as phase change material 46, it is a common material used in semiconductor manufacturing, and it provides a good diffusion barrier at the higher temperatures at which phase change material 46 transitions, typically in the 600-700° C. range. Plugs 20, 22 and common source line 24 are typically made of tungsten or other suitable materials.

Embodiments of the memory cell include phase change based memory materials, including chalcogenide based materials and other materials, for phase change material 46. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a+b)}$.

One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, columns 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. A material useful for implementation of a PCRAM described herein is $Ge_2Sb_2Te_5$, commonly referred to as GST. Other types of phase change materials can also be used.

Other programmable resistive materials may be used in other embodiments of the invention, including $N_2$ doped GST, $Ge_xSb_y$, or other material that uses different crystal phase changes to determine resistance; $Pr_xCa_yMnO_3$, PrSrMnO, ZrOx, or other material that uses an electrical pulse to change the resistance state; 7,7,8,8-tetracyanoquinodimethane (TCNQ), methanofullerene 6,6-phenyl C61-butyric acid methyl ester (PCBM), TCNQ-PCBM, Cu-TCNQ, Ag-TCNQ, C60-TCNQ, TCNQ doped with other metal, or any other polymer material that has bistable or multi-stable resistance state controlled by an electrical pulse. For example, another type of memory material that in some situations may be appropriate is a variable resistance ultra thin oxide layer.

For additional information on the manufacture, component materials, use and operation of phase change random access memory devices, see U.S. patent application Ser. No. 11/155,067, filed 17 Jun. 2005, entitled Thin Film Fuse Phase Change Ram And Manufacturing Method.

The invention has been described with reference to phase change materials. However, other memory materials, also sometimes referred to as programmable materials, can also be used. As used in this application, memory materials are those materials having electrical properties that can be changed by the application of energy; the change can be a stepwise change or a continuous change or a combination thereof.

The above descriptions may have used terms such as above, below, top, bottom, over, under, et cetera. These terms are used to aid understanding of the invention are not used in a limiting sense.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

Any and all patents, patent applications and printed publications referred to above are hereby incorporated by reference.

What is claimed is:

1. A method for making a thermally insulated memory device comprising:
   forming a memory cell access layer on a substrate, the memory cell access layer including an interlayer dielectric having an upper surface and contacts exposed on the upper surface;
   depositing a substantially planar first electrode layer on the upper surface contacting said contacts;
   depositing an inter-electrode insulating layer on the first electrode layer;
   creating a via within the inter-electrode insulating layer;
   forming a thermal insulator having an open region within the via;
   depositing a memory material within the open region;
   depositing a second electrode layer over and in contact with the memory material; and
   etching the second electrode layer, inter-electrode insulating layer and first electrode layer according to a pattern defining an electrically isolated memory cell including the memory material within the via.

2. The method according to claim 1 wherein the thermal insulator has a thermal insulation value greater than the thermal insulation value of the inter-electrode insulating layer.

3. The method according to claim 1 wherein the memory material comprises a phase change material having an amorphous state, and the thermal insulator has a thermal insulation value greater than a thermal insulation value of the phase change material in the amorphous state.

4. The method according to claim 1 wherein the thermal insulation value of the thermal insulator is at least 10% greater than the thermal insulation value of the inter-electrode insulating layer.

5. The method according to claim 1 wherein the memory material depositing step comprises depositing a phase change material within the open region.

6. The method according to claim 1 wherein the contact exposed at the upper surface of the interlayer dielectric comprises an upper end of a plug contacting a doped region in a semiconductor substrate.

7. The method according to claim 1 wherein the first electrode depositing step comprises filling imperfections in an upper end of a plug with the first electrode layer.

8. The method according to claim 1 wherein the via creating step comprises aligning the via with an upper end of a plug and extending the via to the first electrode layer.

9. The method according to claim 1 wherein the thermal insulator forming step comprises forming a sidewall structure having an inside surface tapering inwardly from an electrode surface of the second electrode towards the electrode surface of the first electrode so that a cross-sectional area of the insulated via is smaller at the first electrode than at the second electrode.

10. The method according to claim 1 wherein said depositing a substantially planar first electrode layer comprises depositing a first layer of conductive material, planarizing the first layer of conductive material, and depositing a second layer of phase change material on the planarized first layer of material.

* * * * *